(12) United States Patent
Selbrede

(10) Patent No.: US 7,256,927 B2
(45) Date of Patent: Aug. 14, 2007

(54) DOUBLE-ELECTRET MEMS ACTUATOR

(75) Inventor: Martin G. Selbrede, Austin, TX (US)

(73) Assignee: Uni-Pixel Displays, Inc., The Woodlands, TX (US)

( * ) Notice: Subject to any disclaimer, the term of this patent is extended or adjusted under 35 U.S.C. 154(b) by 0 days.

(21) Appl. No.: 10/506,653

(22) PCT Filed: Mar. 11, 2003

(86) PCT No.: PCT/US03/07577

§ 371 (c)(1),
(2), (4) Date: Sep. 26, 2005

(87) PCT Pub. No.: WO03/079384

PCT Pub. Date: Sep. 25, 2003

(65) Prior Publication Data

US 2006/0066934 A1    Mar. 30, 2006

Related U.S. Application Data

(60) Provisional application No. 60/363,071, filed on Mar. 11, 2002.

(51) Int. Cl.
*G02B 26/00* (2006.01)
(52) U.S. Cl. .................................. 359/291
(58) Field of Classification Search ........ 359/291, 359/292, 295, 298; 320/160, 166, 167; 307/400
See application file for complete search history.

(56) References Cited

U.S. PATENT DOCUMENTS

| 4,078,183 | A | * | 3/1978 | Lewiner et al. ............. 307/112 |
| 4,194,189 | A | * | 3/1980 | Lewiner et al. ........ 340/815.83 |
| 6,188,772 | B1 | | 2/2001 | Norris et al. |
| 6,307,663 | B1 | | 10/2001 | Kowarz ..................... 359/231 |

* cited by examiner

*Primary Examiner*—Ricky Mack
*Assistant Examiner*—Tuyen Tra
(74) *Attorney, Agent, or Firm*—Fish & Richardson P.C.; Kelly Kordzik

(57) ABSTRACT

An actuator (100) taking advantage of ponderomotive forces to enhance its electromechanical performance as a function of input energy. An actuator (100) may include a first conductive layer (102) residing on a first electret layer (101). The actuator (100) may further include a moveable second electret layer (103) which is spaced apart in relation to the first conductive layer (102) when the second electret layer (103) is in a quiescent state. The actuator (100) may further include a second conductive layer (104) in a spaced apart relation to the second electret layer (103) when the second electret layer (103) is in the quiescent state. The actuator (100) may further include a voltage source (105) configured to selectively apply a voltage between the first (102) and second (104) conductive layers thereby propelling the second electret layer (103) to either the first (102) or second (104) conductive layer.

23 Claims, 2 Drawing Sheets

Quiescent State

Actuated State

DOUBLE-ELECTRET MEMS ACTUATOR

CROSS REFERENCE TO RELATED APPLICATIONS

This application is a National Phase of International Application Serial No. PCT/US03/07577, filed on 11 Mar. 2003. This International application claims priority to and benefit of U.S. Patent Application:

Provisional Application Ser. No. 60/363,071, "Double-Electret MEMS Actuator", filed Mar. 11, 2002.

TECHNICAL FIELD

The present invention relates to the field of Microscopic Electro Mechanical Systems (MEMS) actuators, and more particularly to MEMS actuators configured with internally fixed electrostatic fields to pre-bias the ponderomotive push-pull propulsion of each mobile actuator element thereby enhancing their electromechanical performance as a function of input energy.

BACKGROUND INFORMATION

Actuators, particularly at very small scales, have been constructed in a host of variations, all designed to exploit electrical, electromechanical, and elastomeric effects. The geometries of the actuators may exhibit considerable variety from one device to another, with the actuating elements ranging in shape from thin cantilevered beams to planar deflecting diaphragms.

Microscopic Electro Mechanical Systems (MEMS) actuators may refer to tiny actuator devices that may be built onto semiconductor chips and measured in micrometers. MEMS actuators may find application in a variety of systems ranging from miniaturized fluid pumps to flat panel displays such as those disclosed in U.S. Pat. No. 5,319,491, which is hereby incorporated herein by reference in its entirety.

The applied force of the MEMS actuators (referring to the force used to move or control something) is typically enhanced by applying a mechanical force in a system designed to exploit intrinsic leverage. The applied force of the MEMS actuators may also be enhanced by using iterative techniques such as using interdigitated comb electrodes. For example, a force may be applied at each electrode lined up in a comb fashion where an aggregate force summed over all the teeth in the comb may be used to put the MEMS actuator into motion. However, these structures are fairly complicated and inefficient as a function of input energy.

Therefore, there is a need in the art to enhance the performance of MEMS actuators as a function of input energy using a less complicated structure, while achieving the additional leverage (or "mechanical advantage" as it is often referred to) without adding difficult-to-fabricate mechanical features.

SUMMARY

The problems outlined above may at least in part be solved in some embodiments of the present invention by taking advantage of ponderomotive forces to put into motion MEMS actuators instead of using a mechanical force or iterative techniques thereby enhancing their electromechanical performance as a function of input energy.

In one embodiment of the present invention, an actuator may comprise a first conductive layer residing on a first electret layer. The actuator may further comprise a moveable second electret layer which is spaced apart in relation to the first conductive layer when the second electret layer is in a quiescent state. The actuator may further comprise a second conductive layer in a spaced apart relation to the second electret layer when the second electret layer is in the quiescent state. The actuator may further comprise a voltage source configured to selectively apply a voltage between the first and second conductive layers thereby propelling the second electret layer to one of the first and second conductive layers.

The foregoing has outlined rather broadly the features and technical advantages of one or more embodiments of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

Figure 1A:
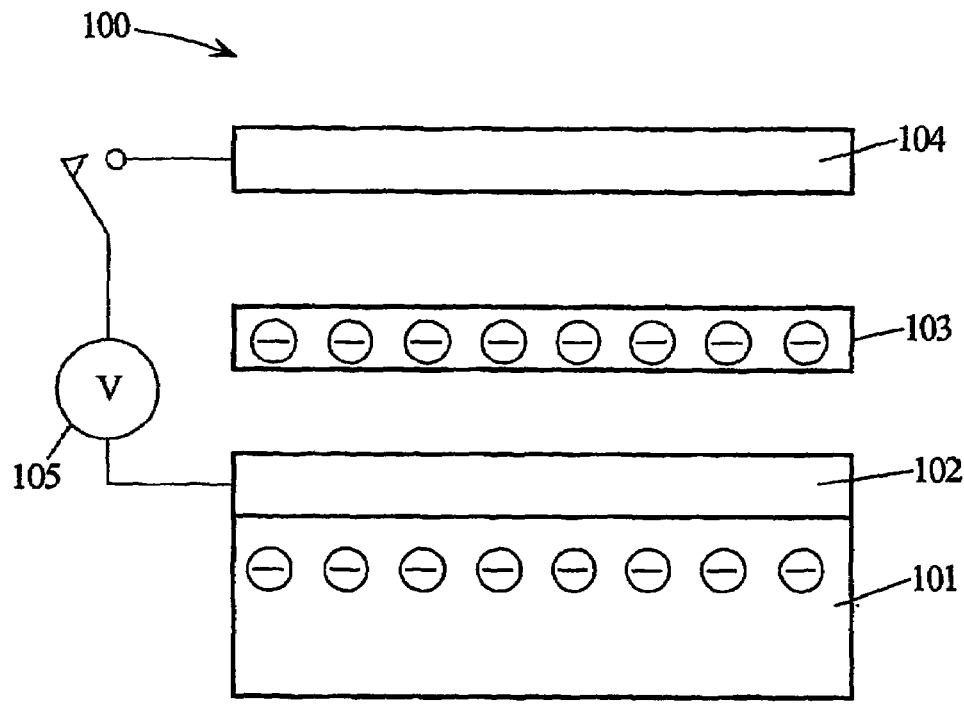
FIG. 1A illustrates a cross-sectional view of a MEMS actuator in a quiescent state in accordance with an embodiment of the present invention.

The present invention comprises an actuator for taking advantage of ponderomotive forces to put the actuator into motion. In one embodiment of the present invention, the actuator may comprise a first conductive layer residing on a first electret layer. The actuator may further comprise a moveable second electret layer which is spaced apart in relation to the first conductive layer when the second electret layer is in a quiescent state. The actuator may further comprise a second conductive layer in a spaced apart relation to the second electret layer when the second electret layer is in the quiescent state. The actuator may further comprise a voltage source configured to selectively apply a voltage between the first and second conductive layers thereby propelling the second electret layer to either the first or second conductive layer.

Although the present invention is described with reference to taking advantage of ponderomotive forces in MEMS actuators, it is noted that the principles of the present invention may be applied to non-miniaturized actuators. It is further noted that a person of ordinary skill in the art would be capable of applying the principles of the present invention as discussed herein to non-miniaturized actuators. It is further noted that embodiments applying the principles of the present invention to such actuators would fall within the scope of the present invention.

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

As stated in the Background Information section, the applied force of the MEMS actuators (referring to the force used to move or control something) is typically enhanced by applying a mechanical force in a system designed to exploit intrinsic leverage. The applied force of the MEMS actuators may also be enhanced by using iterative techniques such as using interdigitated comb electrodes. For example, a force may be applied at each electrode lined up in a comb fashion where an aggregate force summed over all the teeth in the comb may be used to put the MEMS actuator into motion. However, these structures are fairly complicated and inefficient as a function of input energy. Therefore, there is a need in the art to enhance the performance of MEMS actuators as a function of input energy using a less complicated structure, while achieving the mechanical leverage without adding difficult-to-fabricate mechanical features. The performance of MEMS actuators may be enhanced as a function of input energy by taking advantage of ponderomotive forces as discussed below. Ponderomotive forces relate to the mechanical concomitants of electrodynamic forces acting on free or trapped electrical charges.

Figure 1B:
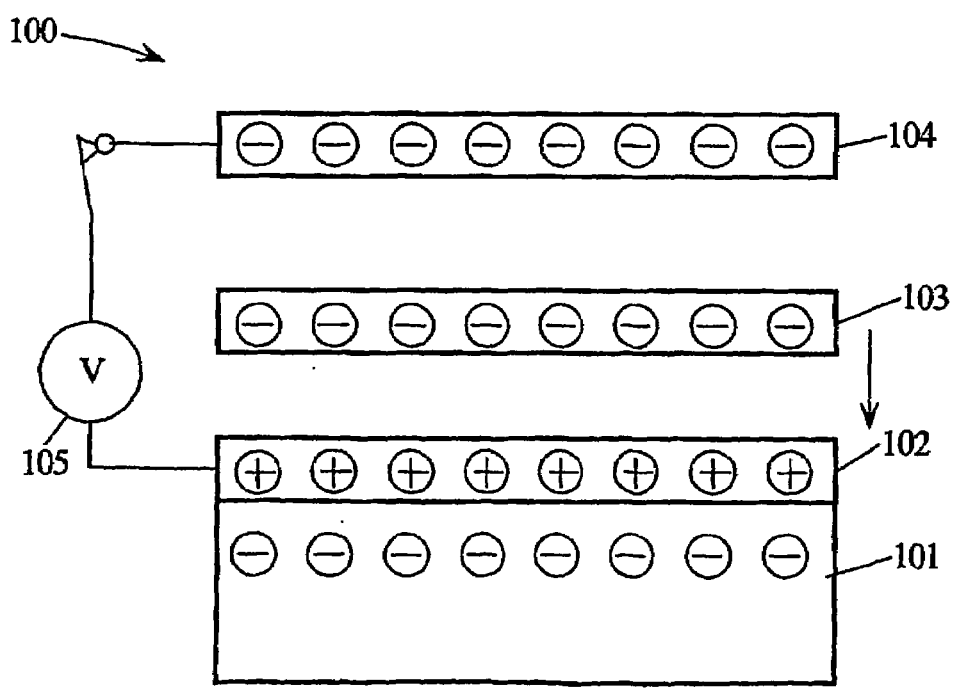
FIG. 1B illustrates a cross-sectional view of a MEMS actuator in an actuated state in accordance with an embodiment of the present invention.

FIGS. 1A-B illustrate an embodiment of the present invention showing a cross-sectional view of MEMS actuator 100 in a quiescent state and in an actuated state, respectively, taking advantage of ponderomotive forces. MEMS actuator 100 may actuate by including an electret layer free to be propelled by electrostatic force thereby enhancing the electromechanical performance of MEMS actuator 100 as a function of input energy. An electret layer may refer to a dielectric body in which either a permanent state of electric polarization has been set up, or in which charges have been trapped in a planar distribution beneath the surface (termed a mono-charged electret). In one embodiment, mono-charged electrets may be formed on Lucite™ (tradename of polymethylmethacrylate) using corona discharge and scanning electron microscopes. MEMS actuator 100 may comprise electret layer 101, an electrode 102, an electret layer 103 (may be mounted to either electrode 104, electret layer 101, or both electrode 104, electret layer 101 by an elastic member, not shown) and an electrode 104. A voltage source 105 may be coupled between electrodes 102, 104. The electrodes are understood to be conductive, while the electret layers are not. Only electret layer 103 has freedom to move, whereby it constitutes the specific element to be propelled by electrostatic force. In one embodiment, both electret layers 101, 103 are negatively charged elements. It is to be understood that electret layers 101, 103 constitute a dielectric material in which the charge is embedded, inasmuch as a mono-charged electret layer may not exist in free space due to the ensuing unrestrained Coulomb repulsion of the constituent electrons or ions. The degrees of freedom of electret layer 103, taken to include the dielectric material in which electret layer 103 may be embedded, presuppose that it may be disposed in such a way that no other element physically impedes its intended movement. For example, it may be situated within or adjacent to an airgap, not otherwise disclosed herein. It is noted that electret layers 101, 103 may comprise mono-charged electrets. Electrets of the mono-charged variety constitute trapped charges within the matrix of the dielectric. It is further noted that, in an alternative embodiment, either electret layer 101, 103 or both electric layers 101, 103 may comprise polarized electrets such that the local static electric field creating the pre-biased condition of MEMS actuator 100 may be generated by a permanent polarization within the electret, in lieu of a mono-charged electret layer generated by introducing charges into the matrix of the dielectric (typically by electron or ion injection at fixed energy levels). It is further noted that a mounting fixture (not shown), e.g., spring, may be attached to conductive layer 104 to hold electret layer 103 in equilibrium. It is further noted that mounting fixtures used in MEMS actuators are known to persons of ordinary skill in the art and that embodiments implementing such mounting fixtures in MEMS actuator 100 would fall within the scope of the present invention.

Referring to FIG. 1A, in the quiescent state, electrostatic repulsion between electret layer 101 and electret layer 103 may keep electret layer 103 as far away as possible from electret layer 101, which effectively corresponds to a detented state given the intrinsic electrostatic bias introduced into this system by the coexistence of the two parallel electret layers 101, 103 having the same charge. This repulsive electrostatic force may constitute the primary restorative force in the system when MEMS actuator 100 is in the quiescent state. When MEMS actuator 100 is in the quiescent state, electret layer 103 naturally moves back to the detented position due to the repulsion between the electret layers 101, 103 arising from their charge polarities being identical.

Referring to FIG. 1B, when a voltage is placed across the two electrodes 102, 104, such that electrode 102 is charged positively while electrode 104 is charged negatively (thus constituting a quasi-capacitive ensemble), it may be appreciated that electret layer 103 is attracted to oppositely-charged electrode 102 while it is simultaneously repelled by like-charged electrode 104, creating a dual "push-pull effect" both acting in the same direction. Electret layer 103 may therefore be propelled much closer to electrode 102 and electret layer 101, until the point that either the electrostatic forces once again balance, the electrostatic and mechanical restorative forces become equal, or mechanical exigencies prevent further motion. Once the two electrodes 102, 104 are discharged, the repulsion effect between electrets 101, 103 again dominates the mechanism, and element 103 is restored to its original detented position as illustrated in FIG. 1A. It is noted that, in an alternative embodiment, a voltage may be placed across the two electrodes 102, 104, such that electrode 102 is charged negatively while electrode 104 is charged positively. Electret layer 103 may then be attracted to oppositely-charged electrode 104 awhile it is simultaneously repelled by like-charged electrode 102, creating a dual "push-pull effect" both acting in the same direction. It is noted that there is no net force on electret layer 101 due to the well-known principle that there is no electric field exterior to a capacitor, such as that formed by electrodes 102 and 104. Forces arising from the charging of these electrodes 102, 104 are necessarily restricted to the volume between them, for which reason electret layer 103 is actuated by ponderomotive forces.

It is noted that in the embodiment disclosed in FIGS. 1A-B, MEMS actuator 100 uses two electret layers 101, 103 to provide an electrostatic push-pull without reversing the polarity between conductors 102, 104. In an alternative embodiment, electret layer 101 may be omitted while the polarity of the potential between 102 and 104 is reversed to change the direction in which element 103 is being electrostatically propelled, which still provides an electrical push-pull actuator (an actuator in which electrostatic effects account for bi-directional motion of the element being propelled).

It should be appreciated that the presence of electret layer 101 may create an initial electrostatic bias in the mechanical system of which electret layer 103 may be the sole mobile member. The created bias may be leveraged during the turn-off cycle of the system.

Figure 2A:
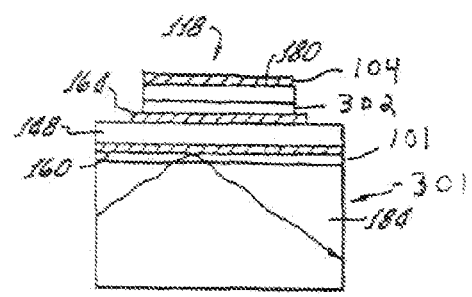
FIGS. 2A—2B illustrate a pixel in a light guide.
Figure 2B:
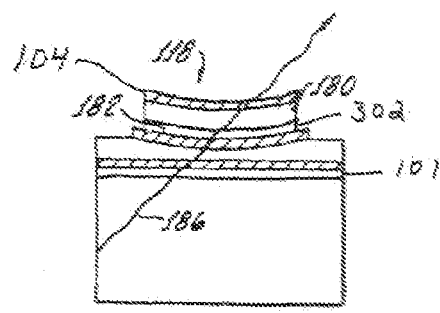

It should be further appreciated that MEMS actuator 100 may be incorporated as the underlying electromechanical drive scheme for devices such as those disclosed in U.S. Pat. No. 5,319,491 (FIGS. 16 and 17). By doing so, frustration of the total internal reflection of light may occur within electret layer 103. Referring to FIG. 1, it is noted that electret layer 101 in the present invention may correspond to an electret layer embedded just under the surface of the light guide disclosed in U.S. Pat. No. 5,319,491 (FIGS. 16 and 17), in which light is traveling at angles under the critical angle for total internal reflection within the light guide. FIGS. 16 and 17 are reproduced herein as FIGS. 2A and 2B. Electret layer 101 is embedded in substrate 301. Electrode 102 may correspond to the conductor 160 disposed on the top of the light guide as disclosed in U.S. Pat. No. 5,319,491 (FIGS. 16 and 17). Electret layer 103 may correspond to an electret layer 302 embedded in the high refractive index deformable dielectric 180 as disclosed in U.S. Pat. No. 5,319,491 (FIGS. 16 and 17). Electrode 104 may be disposed in a fixed spaced-apart relation parallel to electrode 102 with electret layer 103 being disposed between electrodes 102 and 104. In contrast to a global motion of electret layer 103 as an aggregate body, it may undergo deflection and/or deformation under application of the appropriate voltage (see FIGS. 1A and 1B) to the elctrodes 102,104, propelling the high refractive index 180 in which electret layer 103 (302) may be embedded closer than one wavelength of light to the surface of the light guide 301 in which electret layer 101 is embedded. The light 186 traveling in the light guide 301, which generates an evanescent, inhomogeneous wave along the surface of the light guide, may be able to leap the gap and travel into the portions of the high refractive index dielectric 180, of which electret layer 103 (302) is a part, that are closer than one wavelength from the surface of the light guide 301. The propulsion of electret layer 103 (302) is thus to be understood as embracing not only motion of electret layer 103 as a rigid unit, but also deformations and other mechanical transformations induced by the ponderomotive forces arising under application of appropriate voltages to electrodes 102, 104.

Although the MEMS actuator is described in connection with several embodiments, it is not intended to be limited to the specific forms set forth herein; but on the contrary, it is intended to cover such alternatives, modifications and equivalents, as can be reasonably included within the spirit and scope of the invention.

The invention claimed is:

1. An actuator, comprising:
a first electret layer having an electrical charge, said first electret layer embedded in a light guidance substrate;
a first conductive layer residing on said light guidance substate;
a moveable second electret layer embedded in a deformable delectric layer in a spaced apart relation to said first conductive layer in a quiescent state;
a second conductive layer disposed on said deformable dielectric layer in a spaced apart relation to said second electret layer in said quiescent state; and
a voltage source configured to selectively apply a voltage between said first and said second conductive layers.

2. The actuator as recited in claim 1, wherein said voltage applied between said first and said second conductive layer results in propelling said second electret layer to one of said first and said second conductive layers.

3. The actuator as recited in claim 1, wherein said second electret layer has an electric charge of a same polarity as said electric charge of said first electret layer, wherein said second electret layer is operable for propelling toward said first electret layer in response to said voltage source applying a charge having an opposite polarity of said polarity of said charge of said first electret layer to said first conductive layer.

4. The actuator as recited in claim 1, wherein said second electret layer has an electric charge of a same polarity as said electric charge of said first electret layer, wherein said second electret layer is operable for propelling toward said second conductive layer in response to said voltage source applying a charge having an opposite polarity of said polarity of said charge of said first electret layer to said second conductive layer.

5. The actuator as recited in claim 1, wherein upon equalizing a potential difference between said first and said second conductive layers said second electret returns to its quiescent state.

6. The actuator as recited in claim 1, wherein said first and said second electret layers comprise mono-charged electrets.

7. The actuator as recited in claim 1, wherein said first and said second electret layers comprise polarized electrets.

8. The actuator as recited in claim 1, wherein said first electret layer comprises polarized electrets.

9. The actuator as recited in claim 1, wherein said second electret layer comprises polarized electrets.

10. The actuator as recited in claim 1, wherein said second electret layer and said deformable dielectric layer undergo deformation as a result of said voltage source selectively applying said voltage between said first and said second conductive layers.

11. The actuator as recited in claim 10, wherein said second electret layer and said deformable dielectric layer are restored to an undeformed state upon equalizing a potential difference between said first and said second conductive layers.

12. An actuator, comprising:
a first electret layer having an electrical charge;
a first conductive layer residing on said first electret layer;
a moveable second electet layer, wherein said second electret layer is in a spaced apart releation to said first conductive layer in a quiescent state;
a second conductive layer in a spaced apart relation to said second electret layer in said quiescent state; and
a voltgage source configured to selectively apply a voltgage between said first and said second conductive layers, wherein frustration of total internal reflection of light occurs by means of said second electret layer.

13. The actuator as recited in claim 12, wherein a low refractive index gap between dielectric materials associated with said first and said second electret layers alternates between distances larger and smaller than one wavelength of light as a function of a potential difference selectively applied between said first and said second conductive layers thereby providing means to frustrate said total internal reflection of light and allow light to leap said gap into said second electret layer.

14. An actuator, comprising:
a first electret layer having an electric charge;
a first conductive layer;
a moveable second electret layer, wherein said movable second electret layer is in a spaced apart relation to said first conductive layer in a quiescent state, wherein said first conductive layer is positioned between said first electret layer and said moveable second electret layer;

a second conductive layer in a spaced apart relation to said movable second electret layer in said quiescent state, said moveable second electret layer positioned between and first conductive layer and said second conductive layer; and a voltage source configured to selectively apply a voltage between said first and said second conductive layers.

15. The actuator as recited in claim 14, wherein said voltage applied between said first and said second conductive layers results in propelling said moveable second electret layer to one of said first and said second conductive layers 16. The actuator as recited in claim 14, wherein said moveable second electret layer is operable for propelling toward said first conductive layer in response to said voltage source applying a charge having an opposite polarity of a polarity of a charge of said moveable second electret layer to said first conductive layer.

17. The actuator as recited in claim 14, wherein said moveable second electret layer is operable for propelling toward said second conductive layer in response to said voltage source applying a charge having an opposite polarity of a polarity of a charge of said movable second electret layer to said second conductive layer.

18. The actuator as recited in claim 14, wherein upon equalizing a potential difference between said first and said second conductive layers said moveable second electret layer returns to its quiescent state.

19. The actuator as recited in claim 14, wherein said moveable second electret layer comprises mono-charged electrets.

20. The actuator as recited in claim 14, wherein said moveable second electret layer undergoes deformation as a result of said voltage source selectively applying said voltage between said first and said second conductive layers.

21. The actuator as recited in claim 20, wherein said moveable second electret layer is restored to an undeformed state upon equalizing a potential difference between said first and said second conductive layers.

22. The actuator as recited in claim 14, wherein frustration of total internal reflection of light occurs by means of said moveable second electret layer.

23. The actuator as recited in claim 22, wherein a low refractive index gap between dielectric materials associated with said first conductive layer and said movable second electret layer alternates between distances larger and smaller than one wavelength of light as a function of a potential difference selectively applied between said first and said second conductive layers thereby providing means to frustrate said total internal reflection of light and allow light to leap said gap into said moveable second electret layer.

* * * * *